(12) United States Patent
Poddar et al.

(10) Patent No.: US 12,074,134 B2
(45) Date of Patent: Aug. 27, 2024

(54) PACKAGE FOR STRESS SENSITIVE COMPONENT AND SEMICONDUCTOR DEVICE

(71) Applicant: Texas Instruments Incorporated, Dallas, TX (US)

(72) Inventors: Anindya Poddar, Sunnyvale, CA (US); Mahmud Chowdhury, Richardson, TX (US); Hau Nguyen, San Jose, CA (US); Masamitsu Matsuura, Beppu (JP); Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 184 days.

(21) Appl. No.: 17/364,769

(22) Filed: Jun. 30, 2021

(65) Prior Publication Data
US 2023/0005881 A1 Jan. 5, 2023

(51) Int. Cl.
*H01L 23/48* (2006.01)
*H01L 21/56* (2006.01)
(Continued)

(52) U.S. Cl.
CPC .......... *H01L 24/94* (2013.01); *H01L 21/563* (2013.01); *H01L 21/565* (2013.01); *H01L 23/3171* (2013.01); *H01L 23/49816* (2013.01); *H01L 23/49822* (2013.01); *H01L 24/11* (2013.01); *H01L 24/16* (2013.01); *H01L 25/0657* (2013.01); *H01L 24/95* (2013.01);
(Continued)

(58) Field of Classification Search
CPC ..... H01L 24/94; H01L 21/563; H01L 21/565; H01L 23/3171; H01L 23/49816; H01L 23/49822; H01L 24/11; H01L 24/16; H01L 25/0657; H01L 2924/182; H01L 23/3114; H01L 2221/68327; H01L 21/6836; H01L 23/3107; H01L 24/12; H01L 23/315; H01L 23/3121; H03H 9/0523; H03H 3/02; H03H 9/105
See application file for complete search history.

(56) References Cited

U.S. PATENT DOCUMENTS

| | | | |
|---|---|---|---|
| 6,911,727 B1 * | 6/2005 | Martin | G01P 1/023 |
| | | | 257/710 |
| 9,108,841 B1 * | 8/2015 | Bowles | B81B 7/02 |

(Continued)

*Primary Examiner* — Nicholas J Tobergte
(74) *Attorney, Agent, or Firm* — Dawn Jos; Frank D. Cimino

(57) ABSTRACT

In a described example, an apparatus includes: a first semiconductor die with a component on a first surface; a second semiconductor die mounted on a package substrate and having a third surface facing away from the package substrate; a solder seal bonded to and extending from the first surface of the first semiconductor die flip chip mounted to the third surface of the second semiconductor die, the solder seal at least partially surrounding the stress sensitive component; a first solder joint formed between the solder seal and the third surface of the second semiconductor die; a second solder joint formed between solder at an end of the post connect and the third surface of the second semiconductor die; and a mold compound covering the second surface of the first semiconductor die, a portion of the second semiconductor die, and an outside periphery of the solder seal.

19 Claims, 13 Drawing Sheets

(51) Int. Cl.
  *H01L 23/00*     (2006.01)
  *H01L 23/31*     (2006.01)
  *H01L 23/498*    (2006.01)
  *H01L 25/065*    (2023.01)

(52) U.S. Cl.
  CPC .............. *H01L 2224/10126* (2013.01); *H01L 2224/10145* (2013.01); *H01L 2224/11849* (2013.01); *H01L 2224/16146* (2013.01); *H01L 2225/06513* (2013.01); *H01L 2924/182* (2013.01)

(56) References Cited

U.S. PATENT DOCUMENTS

| | | | | |
|---|---|---|---|---|
| 9,153,543 | B1* | 10/2015 | Mangrum | H01L 24/49 |
| 2003/0142913 | A1* | 7/2003 | Li | G02B 6/43 |
| | | | | 385/47 |
| 2003/0160310 | A1* | 8/2003 | Langhorn | H01L 23/15 |
| | | | | 257/E23.009 |
| 2004/0007750 | A1* | 1/2004 | Anderson | B81B 7/007 |
| | | | | 257/414 |
| 2008/0099908 | A1* | 5/2008 | Wang | B81C 1/00269 |
| | | | | 257/E23.193 |
| 2009/0027869 | A1* | 1/2009 | Uchida | B29C 45/14639 |
| | | | | 361/829 |
| 2013/0249109 | A1* | 9/2013 | Ma | G01P 15/0802 |
| | | | | 257/774 |
| 2014/0048946 | A1* | 2/2014 | Bowles | H01L 24/94 |
| | | | | 257/774 |
| 2014/0217521 | A1* | 8/2014 | Johari-Galle | B81B 7/0048 |
| | | | | 438/51 |

* cited by examiner

PACKAGE FOR STRESS SENSITIVE COMPONENT AND SEMICONDUCTOR DEVICE

TECHNICAL FIELD

This disclosure generally to semiconductor device packaging, and more particularly to a semiconductor device package with a stress sensitive component.

BACKGROUND

Stress sensitive components are sometimes packaged with related semiconductor dies. Stress sensitive components are components that have electrical characteristics that are adversely affected by mechanical stress. Examples include precision reference circuits, diodes, filters, sensors, resonators, analog-to-digital converters (ADCs), resistors, capacitors, inductors and coils. In one example a bulk acoustic wave (BAW) device used as a resonator is a stress sensitive component. The stress sensitive component can be formed on a first semiconductor die that placed is in proximity to a second semiconductor die. The second semiconductor die can be a driver die or controller die that is coupled with the first die including the stress sensitive component to form a circuit. The first semiconductor die and the second semiconductor die can be packaged together, for example by bonding the two dies to a package substrate and then encapsulating the two semiconductor dies and portions of the package substrate in a dielectric material, such as mold compound.

Mold compound is an epoxy resin composition. The mold compound can be filled with particles such as silica or aluminum oxide particles. Filler can comprise over 90% of the mold compound by weight. The mold compound is either a liquid at room temperature or a solid at room temperature. If a solid, it can be heated to a liquid state before being used in molding. The liquid mold compound is injected or otherwise transferred into a mold containing the package substrate and die. After the mold compound cools, the packaged semiconductor device is removed from the mold. During curing and cooling the mold compound shrinks and applies unwanted compressive and/or shear stress to the dies and to the stress sensitive component in the packaged device. Mold compounds can have curing stresses in the range of twenty to several hundred mega (million) pascals (MPa). Stress on the semiconductor die and the stress sensitive component can be amplified when concentrated by points on filler particles within the mold compound that are pressing against the semiconductor device or the stress sensitive component. Larger filler particles concentrate more stress and apply more pressure against the devices.

The stress sensitive component may have electrical properties that are adversely changed by compressive and/or shear stress. Random placement of large filler particles in mold compound can apply force to some stress sensitive components differently from others in the same package process, resulting in non-uniform performance of like devices across completed units in a single lot, or across different lots of the packaged devices. Additional mechanical stress can result from other materials in the package, such as underfill.

SUMMARY

In a described example, an apparatus includes: a first semiconductor die with a component on a first surface, the first semiconductor die having an opposite second surface; a second semiconductor die mounted on a package substrate and having a third surface facing away from the package substrate; a solder seal bonded to and extending from the first surface of the first semiconductor die which is flip chip mounted to the third surface of the second semiconductor die, the solder seal at least partially surrounding the component; a first solder joint formed between the solder seal and a dielectric material overlying the third surface of the second semiconductor die; a post connect extending from the first surface of the first semiconductor die; a second solder joint formed between solder at an end of the post connect and a conductive land on a dielectric layer overlying the third surface of the second semiconductor die; and a dielectric material covering the second surface of the first semiconductor die, a portion of the second semiconductor die, and an outside surface of the solder seal.

DETAILED DESCRIPTION

Corresponding numerals and symbols in the different figures generally refer to corresponding parts unless otherwise indicated. The figures are not necessarily drawn to scale.

In the arrangements, unwanted stress on a stress-sensitive component is reduced or eliminated by flip-chip mounting a first semiconductor die including the stress-sensitive component onto a surface of a second semiconductor die, and using a solder seal to form a cavity around the stress-sensitive component. In some arrangements, assembly is done at a wafer scale, prior to forming a package body in an encapsulation process using mold compound. The cavity spaces the stress-sensitive component from other materials such as mold compound, reducing mechanical stress and reducing or eliminating adverse changes in device characteristics of the stress sensitive component due to mold compound stress. In alternative arrangements, a chip scale package (CSP) is formed with the stress sensitive component in a cavity. The cavity reduces mechanical stress on the stress sensitive component and is effective in reducing or eliminating adverse changes in device characteristics due to mechanical stress.

In the arrangements described herein, the term "package substrate" is used. As used herein, a package substrate is a support having a surface suitable for mounting a semiconductor device. In the arrangements, useful package substrates can include: lead frames of copper, copper alloys, stainless steel or other conductive metals (such as Alloy 42); molded interconnect substrates (MIS); pre-molded lead frames (PMLFs) with lead frame conductors and dielectric material in a preformed structure; tape based and film-based substrates carrying conductors; laminate substrates with multiple layers of conductors and insulator layers; and printed circuit board substrates of ceramic, plastic, fiberglass or resin, such as FR4. Lead frames that are "half-etched" or "partially etched" to form portions of different thicknesses, or to form openings in metal layers, can be used.

The term "solder seal" is used herein. A solder seal is a structure formed contemporaneously with forming conductive post connects. The solder seal and the conductive post connects end in solder, and the solder can be used in a solder reflow process to form solder joints to a semiconductor die. The solder seal forms a barrier that surrounds a stress sensitive component, protecting it from the mechanical stress, and prevents contamination of the stress sensitive component from downstream processes and in the field. In the arrangements the solder seal can be a continuous structure, alternatively the solder seal can be formed of segmented portions. The solder seal has an interior surface that surrounds the stress sensitive component, and an exterior surface that faces away from the stress sensitive component.

Figure 1A:
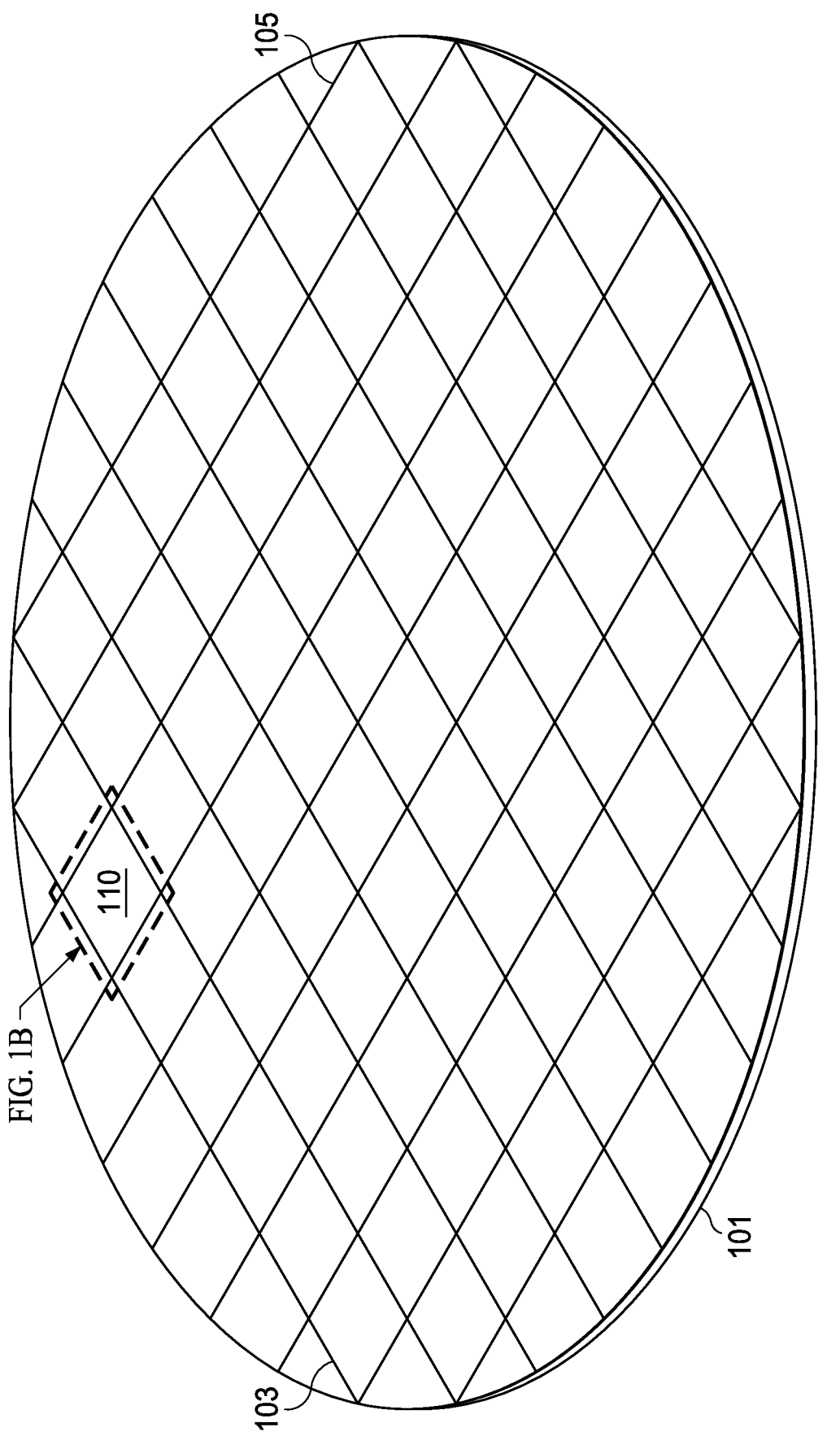
FIGS. 1A-1B are projection views of a semiconductor wafer with device dies and of a unit semiconductor die, respectively.
Figure 1B:
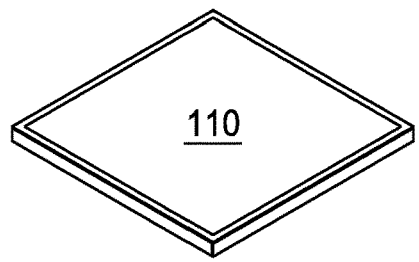

FIGS. 1A-1B illustrate, in projection views, a semiconductor wafer and a semiconductor die. In FIG. 1A, a semiconductor wafer includes semiconductor dies 110 in an array of rows and columns of identical dies. The dies 110 can be integrated circuits, such as an integrated circuit driver device. The dies 110 can be a component, such as a passive component, a sensor, a bulk acoustic wave (BAW) device, a resistor, capacitor, inductor or coil. The dies 110 can be a stress sensitive component that has electrical characteristics that change due to mechanical stress.

Wafer 101 has scribe lines 103 arranged in a first direction and 105 arranged in a second direction that is normal to the first direction. When the dies 110 are complete, the dies are singulated from the wafer 101 using dicing tools such as a dicing saw, or using laser cutting tools to cut along the scribe lines. The individual die 110 in FIG. 1B is one die that has been removed from wafer 101.

Figure 2:
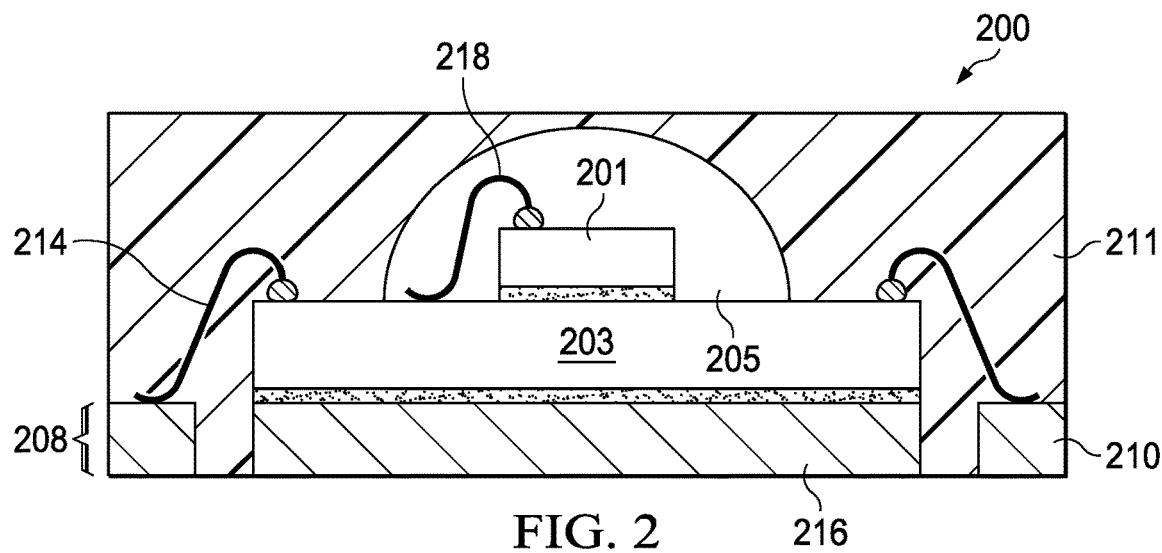
FIG. 2 is a cross sectional view of a packaged device including a stress sensitive component on a first semiconductor die packaged with another semiconductor die.

FIG. 2 illustrates, in a cross sectional view, a packaged device 200 including a stress sensitive component 201. In this example the stress sensitive component 201 is a BAW device mounted with a driver die 203 in packaged device 200. The driver die 203 can be an integrated circuit designed to be used with the stress sensitive component and having terminals coupled to the stress sensitive component. In FIG. 2, the stress sensitive component 201 is mounted with an active surface facing away from the active surface of the driver die 203, or "face up." A low modulus silicone material 205 covers the stress sensitive device 201, this domed shaped material is sometimes referred to as a "glob top." Glob top 205 prevents mold compound 211 from contacting the stress sensitive component 201 and from placing mechanical stress on the stress sensitive component 201. Bond wires 214 electrically connect the driver die 203 to leads 210 on a package substrate 208. In this example, the package substrate is a metal lead frame. In another example, ribbon bonds can be used to electrically connect the leads 210 to the integrated circuit driver die 203. A die pad 216 supports the driver die 203. The example package 200 is a quad flat no-leads (QFN) package. QFN packages have terminals formed of portions of the leads that are exposed from the mold compound, the terminals are coextensive with the package body, so that QFN packages take less board area when mounted (compared to the area of a corresponding leaded package). QFN packages are increasingly used, in part because of the efficient use of board area.

As die sizes and semiconductor package sizes continue to fall, it is desirable to shrink the package for the stress sensitive component. The arrangement in package 200 is limited in size by the need for the integrated driver die 203 to have sufficient surface area to allow for the domed "glob top" material 205 over the stress sensitive component 201, and to allow the edges of the glob top to be spaced from the ball bonds of bond wires 214 to the bond pads (not shown for clarity) of integrated circuit driver die 203. The need for bond wire 218 and for a site for the bond wire stitch on the active surface of semiconductor device die 203 also limits the possibility of shrinking package 200. A photolithographic pattern step is also needed to pattern a passivation layer such as a polyimide layer on the surface of integrated circuit driver die 203, this layer is needed to contain the glob top material 205 around the stress sensitive component 201, so that after deposition it doesn't spread unintentionally over the surface of the integrated circuit driver die 203 and interfere with wire bonds 214.

In the arrangements, a stress sensitive component is formed on one wafer which is singulated to form a first semiconductor die, and the first semiconductor die including the stress sensitive component is mounted on a second semiconductor die that is formed on another wafer. Both types of semiconductor dies are formed using semiconductor processing, although the two devices are quite different in function. The second semiconductor die can be a controller, or driver, device that is coupled to the stress sensitive component of the first semiconductor die.

Figure 3A:
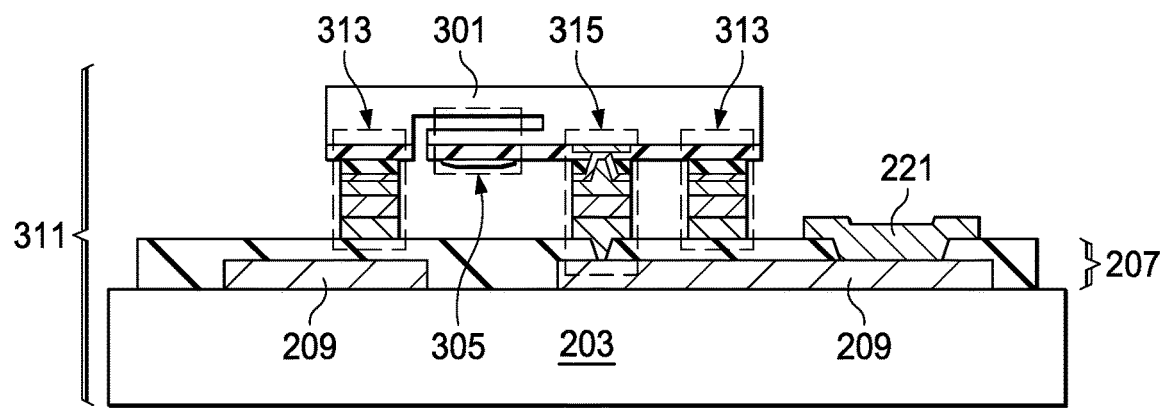
FIG. 3A is a cross sectional view of an arrangement for a first semiconductor die including a stress sensitive component mounted to a second semiconductor die.
Figure 3B:
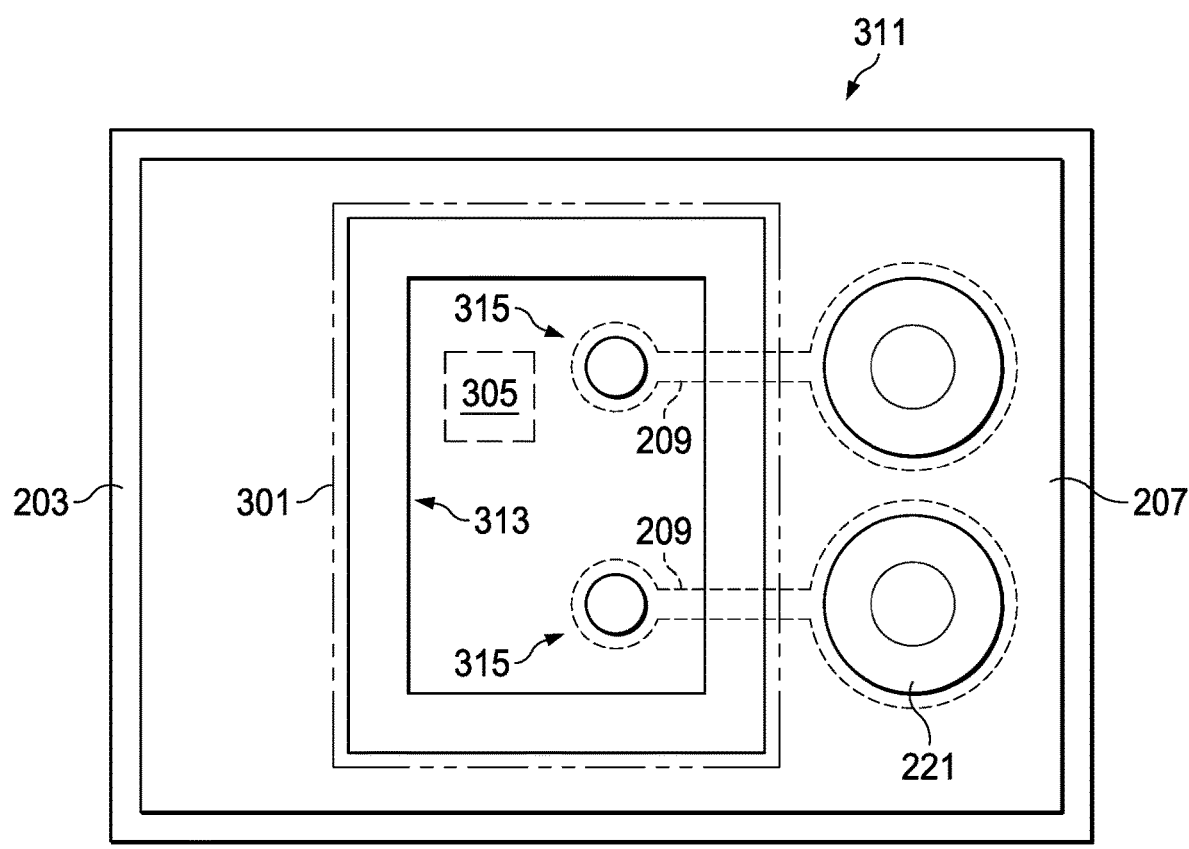
FIG. 3B is a plan view of the arrangement of FIG. 3A.

FIGS. 3A-3B illustrate, in a cross sectional view and plan view, a flip chip structure used in the arrangements. In FIG. 3A, a first semiconductor die 301 includes a stress sensitive component 305 on an active surface. A second semiconductor die 203, which may be a related circuit such as a device driver circuit for the stress sensitive component 305, is arranged with an active surface facing the active surface of the first semiconductor die 301. A passivation layer 207 is formed over the active surface of the second semiconductor die 203. The passivation layer 207 can be a dielectric material such as a polyimide and may include a protective oxide (PO) layer. Multiple layers of dielectric can be used for passivation layer 207, including oxides, nitrides, and oxynitrides. Conductors 209 are formed over the active surface of the second semiconductor die 203 and can form a redistribution layer (RDL) for coupling circuitry formed in the second semiconductor die 203 to the first semiconductor die 301, or to bond pads or terminals. A post connect 315 extends from the first semiconductor die 301 to the second semiconductor die 203. The post connect 315 is a conductive connector that extends from a land on the active surface of the first semiconductor die 301 to the conductor 209 on the second semiconductor die 203. Post connect 315 can be a copper pillar bump, or another conductive material with a solder bump.

A solder seal 313 extends from the first semiconductor die 301 and forms a solder joint to the polyimide 207 on the second semiconductor die 203. In this example, the solder seal 313 forms a continuous barrier that surrounds the stress sensitive component 305 and includes the post connect 315. In the example arrangement of FIG. 3A, the solder seal 313 can be formed simultaneously with the post connect 315, but does not form an electrical connection to the second semiconductor die 203. In this example, the solder seal 313 is floating. In alternative arrangements, solder seal 313 can be electrically coupled to ground or to another potential. Post connect 315 is coupled to a bond pad 221, and can be coupled to circuitry on the second semiconductor die 203. Alternatively the post connect 315 can be coupled to the bond pad 221.

Post connect 315 is a conductive connector that extends between a conductive land on the active surface of the first semiconductor die 301 and the conductor 209 that is over the active surface of the second semiconductor die 203. The post connect 315 can be formed of a copper column formed by electroplating or electroless deposition, and can be formed simultaneously with the solder seal 313. The post connect 315 ends in a solder portion that is also formed by plating, which can be used in a thermal reflow process to form a solder joint between the post connect 315 and the conductor 209.

The first semiconductor die 301 is mounted to the second semiconductor die 203 in a face to face arrangement. Because the first semiconductor die 301 is mounted face down as shown in FIG. 3A, the first semiconductor die 301 is referred to as "flip chip" mounted. The solder seal 313 and the post connect 315 are connected to the conductors 209 over the active surface of the second semiconductor die 203 by solder joints. The flip chip mounted first semiconductor die 301 and second semiconductor die 203 form a structure 311 that is used in forming the arrangements as is further described below. The semiconductor dies 301 and 203 can vary in size from about 50 microns×50 microns to about 5000 microns×5000 microns. The solder seal 313 can have a thickness in range from about 5 microns to about 100 microns. The spacing between the two dies can vary from about 5 microns to about 100 microns, corresponding to the thickness of the solder seal 313.

FIG. 3B is a plan view of the structure 311 of FIG. 3A looking from the backside of the first semiconductor die 301. In FIG. 3B, the active surface of the second semiconductor die 203 is shown surrounding the first semiconductor die 301. The solder seal 313 surrounds the stress sensitive component 305 on the first semiconductor die 301. As is further described below, the solder seal 313 can be formed contemporaneously with the post connect 315 which extends from the first semiconductor die 301. The bond pad 221 is coupled to a conductive land corresponding to the post connect 315 by the conductor 209, which overlies the active surface of the second semiconductor die 203. In an example arrangement, the stress sensitive component 305 on the first semiconductor die 301 is coupled to the post connect 315, and the conductor 209 further couples the post connect 315 to the bond pad 221. While in this illustrated example, the solder seal 313 is a rectangular shape, other shapes can be used, such as circular, oval, or diamond shapes. The shape of the solder seal 313 can be modified to optimize the use of the area of the semiconductor dies. Further, although in the examples of the figures the solder seal 313 is continuous, in alternative arrangements the solder seal 313 can be made in sections that are placed adjacent one another.

Figure 3D:
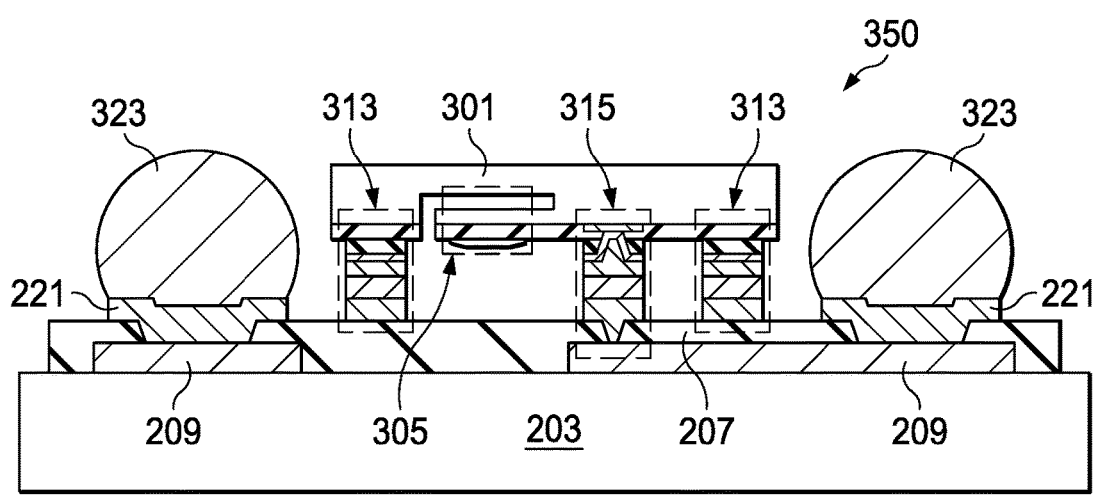
FIG. 3D is a cross sectional view of the arrangement of FIG. 3A in a chip scale ball grid array (BGA) package.
Figure 3C:
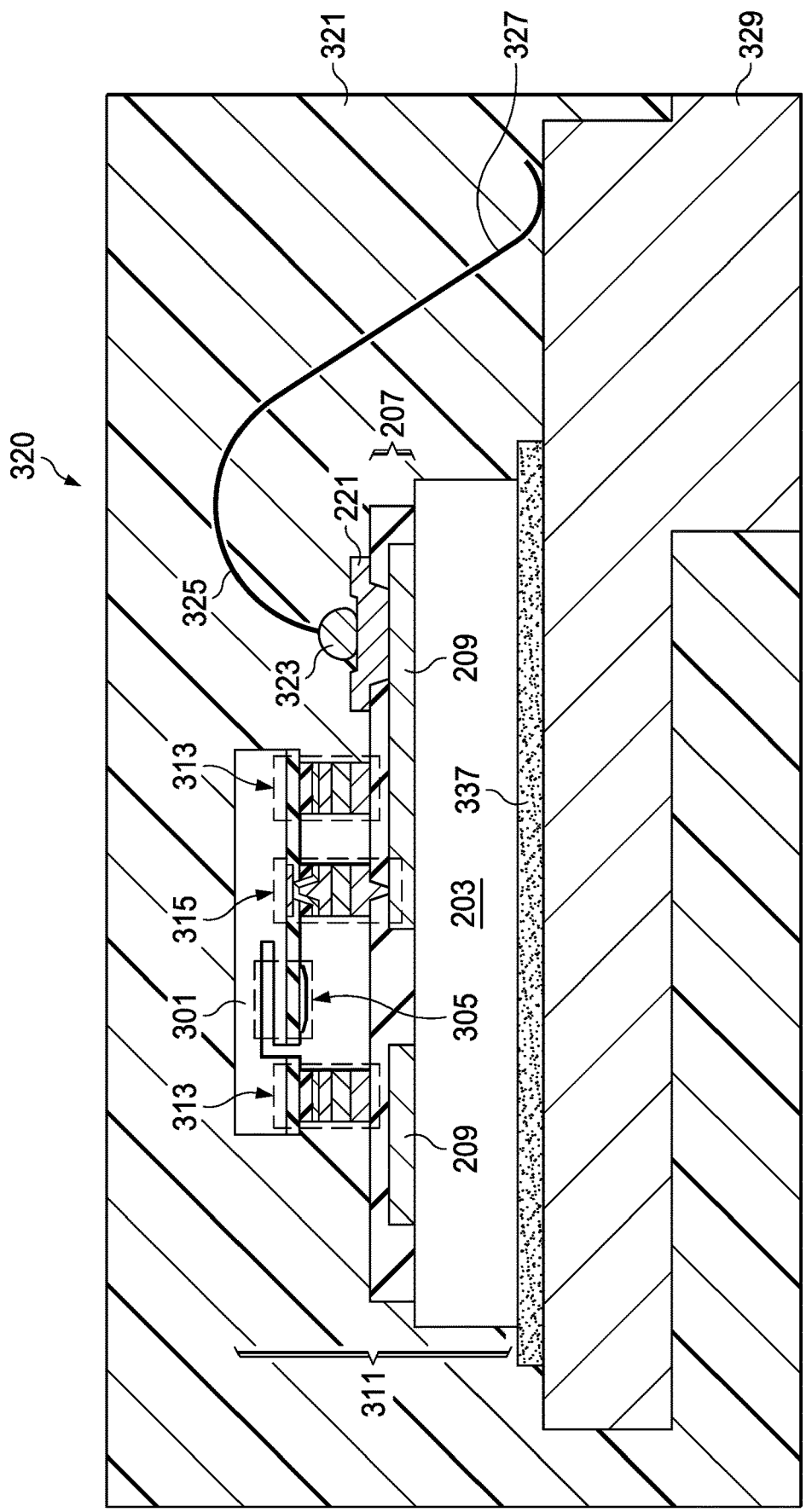
FIG. 3C is a cross sectional view of the arrangement of FIGS. 3A-3B in a wire bonded package.

FIG. 3C is a cross sectional view of an arrangement using the flip chip mounted structure 311 to form a packaged device 320. In FIG. 3C the flip chip mounted structure 311 is mounted to a package substrate 329. In this example a conductive lead frame is used as a package substrate, such as a copper lead frame. A die attach film 337 is used to bond the backside surface of the second semiconductor die 203 to the lead frame 329. A ball 323 on bond wire 325 couples the bond pad 221 to a conductive portion of the lead frame 329, a ball bond 323 is formed on the bond pad 221, and the bond wire 325 extends to a stitch bond 327. In FIG. 3C. a mold compound 321 covers the backside of the first semiconductor die 301, a portion of the second semiconductor die 203, and the bond wire 325, the post connect 315, and a portion of the package substrate 329. Solder seal 313 protects the stress sensitive component 305 from contact with the mold compound 321. The use of the flip chip structure 311 reduces stress on the stress component 305 that would occur if the mold compound 321 was in contact the component. The solder seal 313, the active surface of the second semiconductor die 203 and the active area of the first semiconductor die form a cavity that includes the stress sensitive component 305 and protects it from the mold compound 321. Air is in the cavity.

FIG. 3D illustrates in a cross section an alternative arrangement for a packaged device 350. In FIG. 3D, the first semiconductor device 301 includes a solder seal 313 and a post connect 315 that extend from an active surface of the semiconductor device 301. A stress sensitive component 305 is formed on the active surface of the first semiconductor device 301. The first semiconductor device 301 is flip chip mounted to the active surface of the second semiconductor die 203. Ball grid array terminals, in the form of solder balls 323, are dropped onto bond pads 221. The packaged electronic device 350 is a "chip scale package" (CSP) because the ball grid array balls 323 are formed within the surface area of the second semiconductor die 203, so that the packaged device does not require area greater than the area of the second semiconductor die 203. Stress sensitive component 305 is protected from board stresses by being within a cavity formed by solder seal 313, the surface of the second semiconductor die 203 and polyimide layer 207, and the active surface of the first semiconductor die 301. The stress sensitive component 305 is thus isolated from the board stresses.

FIGS. 4A-4G illustrate, in a series of cross sectional views, some of the steps used in forming the solder seal and the post connects on the first semiconductor die including the stress sensitive component.

Figure 4A:
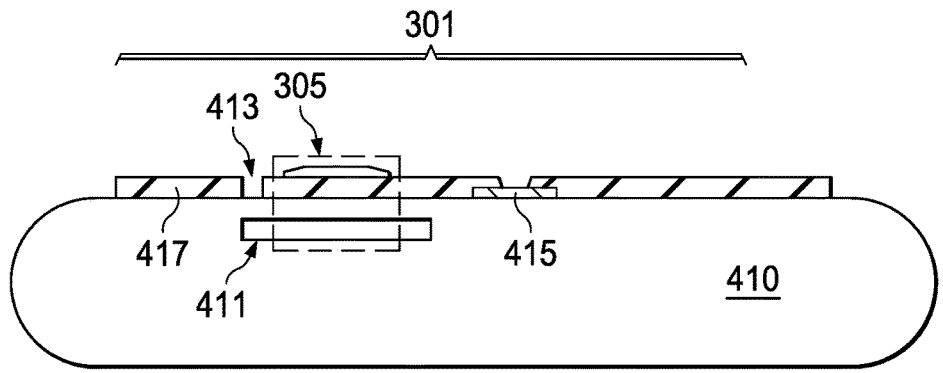
FIGS. 4A-4G illustrate in a series of cross sections selected steps for forming a structure with a stress sensitive component for use in the arrangements.

In FIG. 4A, an incoming in-process wafer 410 includes stress sensitive component 305 formed on an active surface of a semiconductor die 301 that is formed on wafer 410. Although a single die 301 is shown in FIG. 4A for clarity, many identical dies will be formed on wafer 410 simultaneously. A horizontal opening 411 is formed beneath the stress sensitive component 305. A conductive bond pad 415 is exposed from a passivation layer 417, which is a dielectric material that overlies the active surface of the wafer 401. Passivation layer 417 can be formed of an oxide, a nitride, an oxynitride or from other dielectric materials.

Figure 4B:
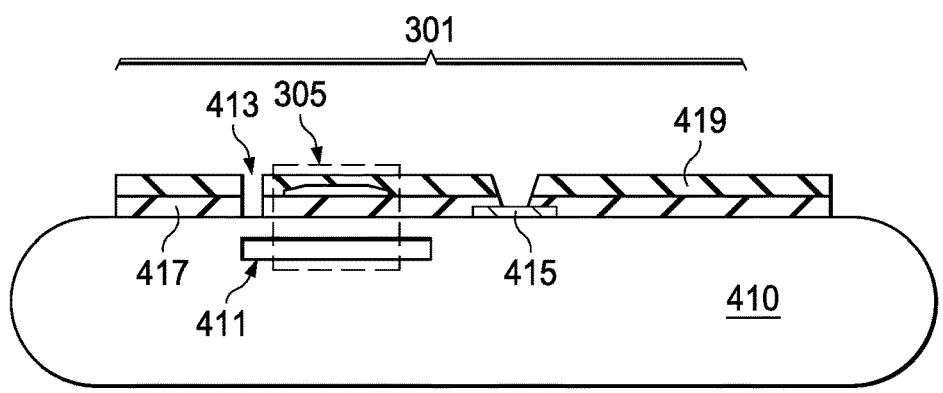

FIG. 4B illustrates the wafer 410 of FIG. 4A after a polyimide layer 419 is deposited over the passivation layer 417 and patterned using photolithography, pattern and etch steps. Bond pad 415 is exposed from the polyimide layer 419, and opening 413 is formed to allow for a semiconductor etch step described later to access the open space 411 to form a "released" stress sensitive component 305. The released stress sensitive component 305 is supported by a cantilever portion of the semiconductor die 301.

Figure 4C:
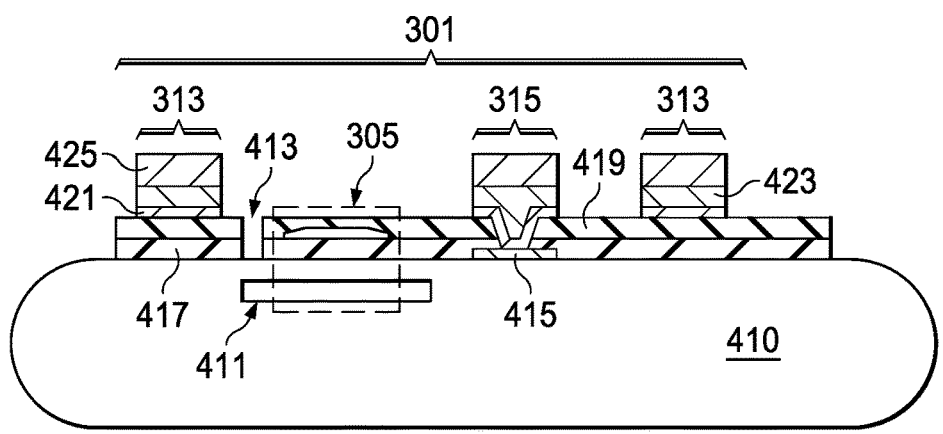

FIG. 4C illustrates the wafer 410 shown in FIG. 4B after a pillar bump process is performed. A seed layer 421, for example a copper seed layer, is sputtered or otherwise deposited over the wafer, and patterned using photolithography. Copper or another metal layer 423 is then plated onto the seed later to form pillars, or columns, on the patterned seed layer. A solder bumping process then forms the solder 425 at the ends of the copper columns or pillars. Solder seal 313 extends from the surface of the polyimide layer 419 and post connect 315 extends from the bond pad 415. In this example solder seal 313 is a continuous rail that extends around the stress sensitive component 305 and surrounds both the stress sensitive component 305 and the post connect 315. In additional alternative arrangements, the solder seal 313 can be made of segments or sections that are placed adjacent to one another to surround the stress sensitive component 305.

Figure 4D:
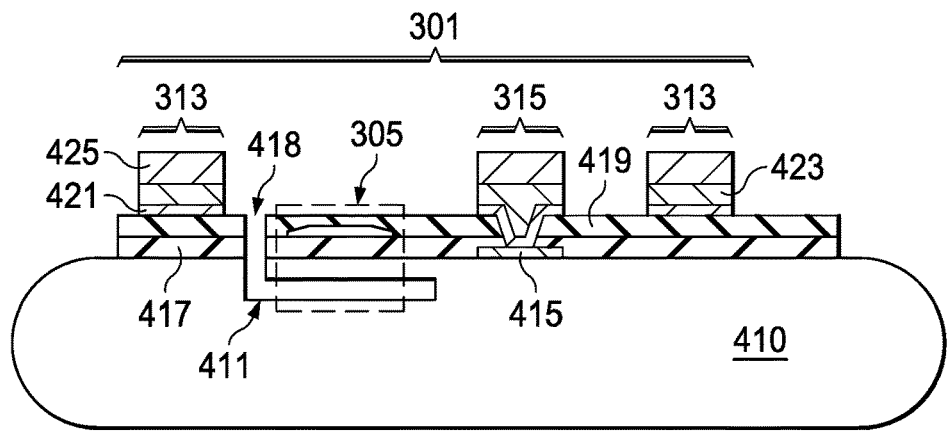

FIG. 4D illustrates the wafer 410 of FIG. 4C after an additional processing step. A trench etching step on the semiconductor substrate of wafer 410 opens a vertical trench 418 extending to the opening 411. This forms a cantilever structure beneath the stress sensitive component 305, releasing stress sensitive component 305 from the remaining material of wafer 410, to reduce stress from the semiconductor substrate on the stress sensitive component 305. The stress sensitive component 305 sits on a cantilever structure.

Figure 4E:
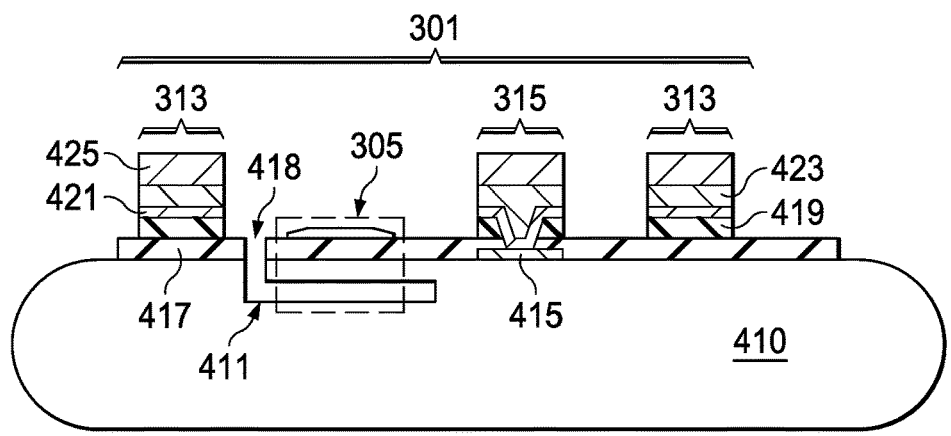

FIG. 4E illustrates the wafer 410 shown in FIG. 4D after an additional processing step to strip the protective polyimide layer 419 (see FIG. 4D) from the stress sensitive component 305 and the surface of the wafer 410, exposing the passivation layer 417. Solder seal 313 is shown surrounding the stress sensitive component 305 and the post connect 315.

Figure 4F:
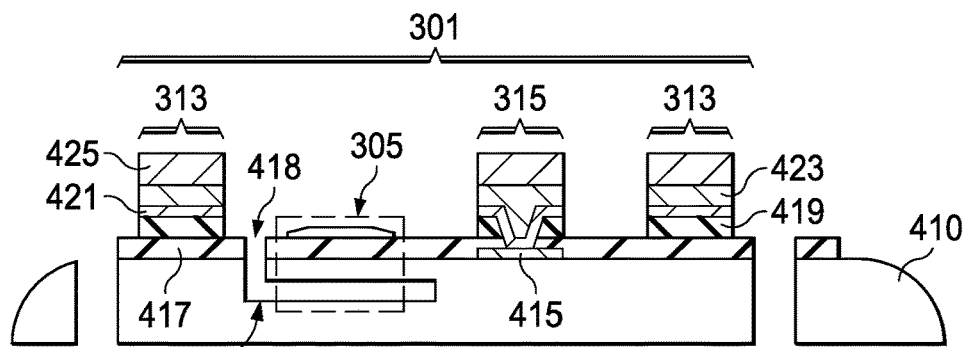

FIG. 4F illustrates the wafer 410 shown in FIG. 4E after a backgrinding and sawing operation is performed. In FIG. 4F, scribe line areas adjacent a semiconductor die 301 are cut through using a mechanical saw or laser to cut through the wafer 410. The wafer 410 can be thinned prior to sawing by a mechanical grinding operation on the backside surface, or backgrinding. The sawing operation separates individual dies 301 (only one die is illustrated for clarity, however wafer 410 will have many dies formed simultaneously, see FIG. 1 for example).

Figure 4G:
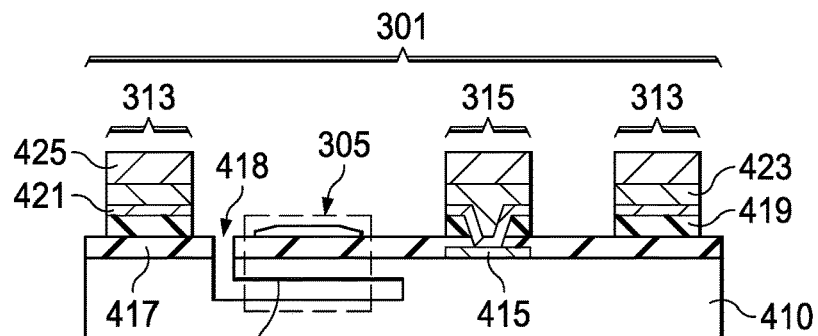

FIG. 4G illustrates a single die 301 separated from the wafer 410 in FIG. 4F. The semiconductor die 301 includes the stress sensitive component 305 formed on an active surface, the solder seal 313 extending from the active surface of the semiconductor die 301, and surrounding the stress sensitive component 305 and post connect 315. The stress sensitive component 305 is released from the semiconductor substrate of semiconductor die 301 by use of the cantilever structure. In alternative arrangements, the stress sensitive component 305 can be isolated from the remainder of the semiconductor substrate by trenches as is further described below. The stress sensitive component 305 can be a transistor, a circuit, a sensor, a passive component or other structure that has characteristics that change undesirably in response to mechanical stress.

Figure 4H:
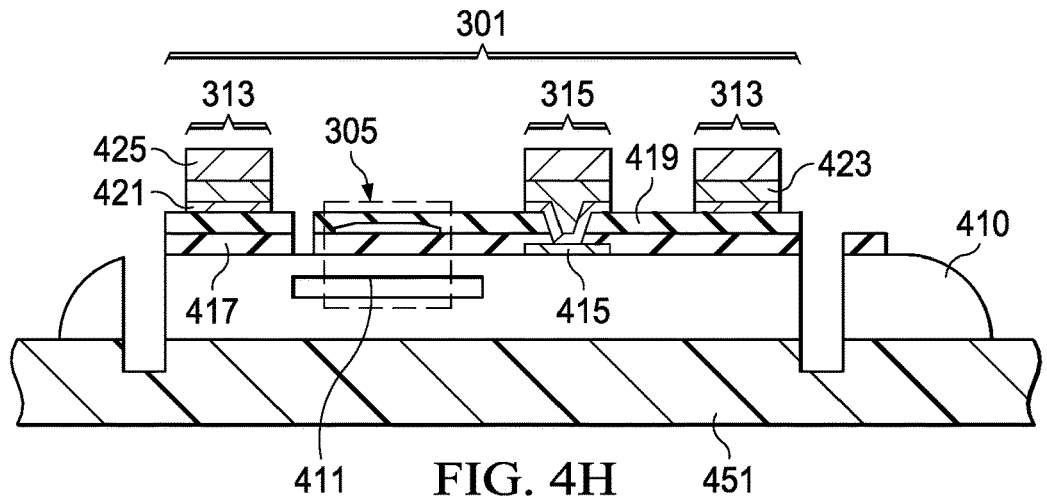
FIGS. 4H-4J illustrate in additional cross sectional views alternative steps for forming the structure with a stress sensitive component for use in the arrangements.
Figure 4I:
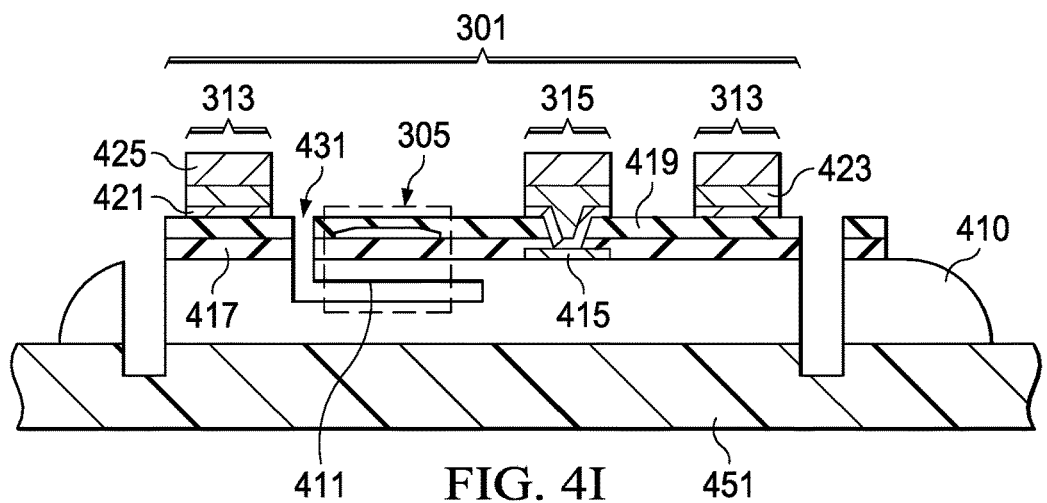
Figure 4J:
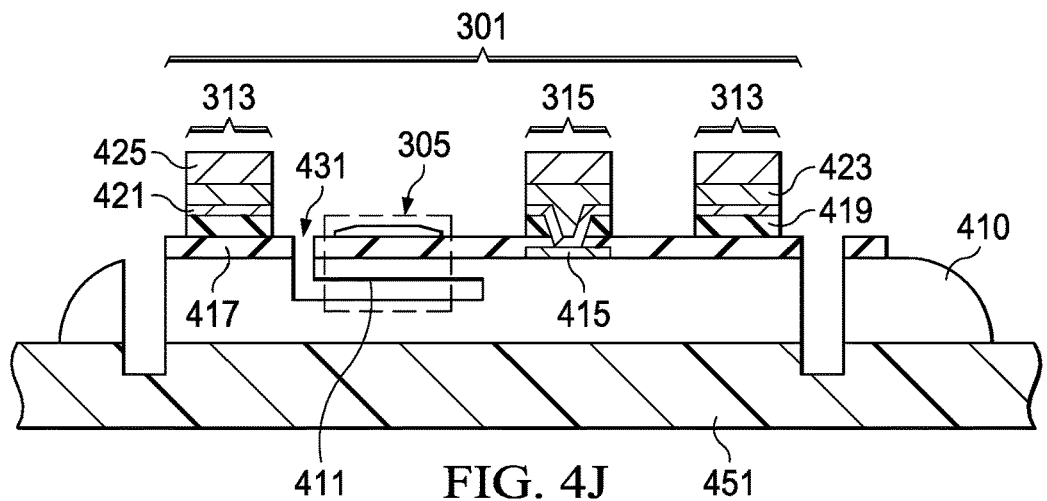

FIGS. 4H-4J show, in cross sectional views, a series of alternative process steps for the semiconductor die 301 shown in FIG. 4G. Beginning with the in process wafer of FIG. 4B, FIG. 4H shows the wafer 410 after a backgrinding and sawing operation. After a backgrinding operation, the semiconductor wafer 410 is mounted on a dicing tape 451 and a mechanical saw is used in scribe lanes between the semiconductor dies 301 to cut through the wafer 410 and separate the semiconductor dies 301 from one another.

FIG. 4I illustrates the wafer 410 shown in FIG. 4H after an additional processing step, a semiconductor etch step. The etch forms an opening 431 in the active surface of wafer 410 that opens to the horizontal opening 411 beneath the stress sensitive component 305. By etching the vertical opening into the semiconductor substrate 410, the stress sensitive component 305 is released from the remaining semiconductor material of wafer 410 and is supported on a cantilever portion of the semiconductor material of wafer 410.

FIG. 4J illustrates the wafer 410 of FIG. 4I after an additional processing step. The polyimide layer 419 is removed in a strip step that exposes the stress sensitive component 305. After the polyimide strip the semiconductor device 301 can be removed from the dicing tape 451, and the result is the singulated semiconductor die as shown in FIG. 4G. The steps of FIGS. 4H-4J are an alternative process for forming the semiconductor die 301 where the semiconductor trench etch is completed after the sawing operation. In the approach shown in FIGS. 4C-4F, the trench etch is performed prior to the backgrinding and sawing operations. The end product of either approach is a singulated semiconductor die including a stress sensitive component.

Figure 5:
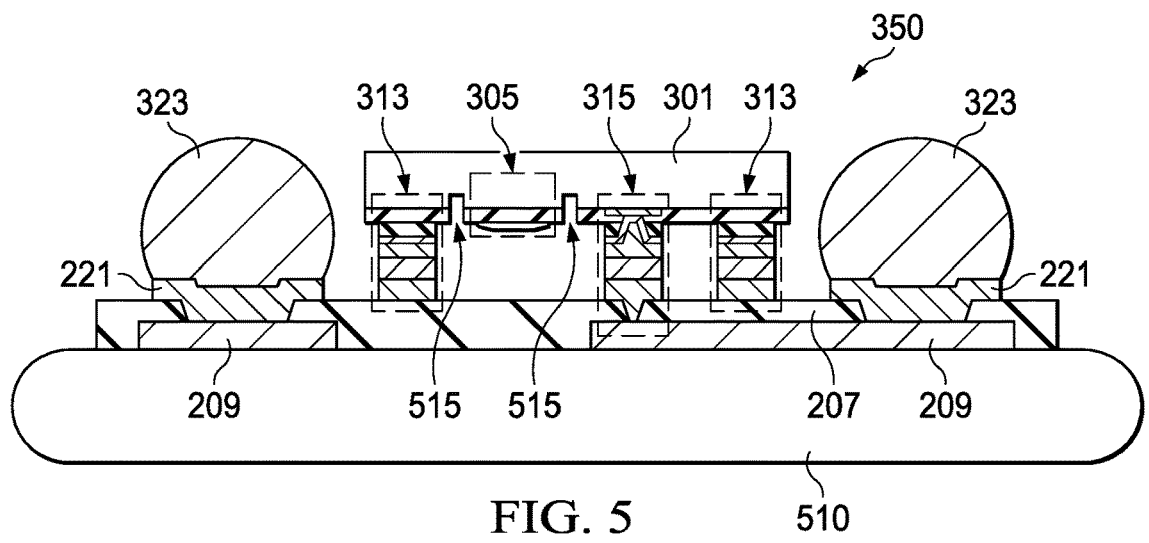
FIG. 5 illustrates in a cross sectional view an in-process wafer for forming a ball grid array package arrangement with a first semiconductor die with a stress sensitive component mounted to a second semiconductor die.

FIG. 5 illustrates in a cross sectional view a step for forming wafer level chip scale package (WCSP) with a stress sensitive component. The semiconductor die 301 including a stress sensitive component 305 is flip chip mounted to a semiconductor wafer 510. Conductors 209 are covered with a polyimide layer 207 layer, and the BGA solder balls 323 are placed on the bond pads 221 and coupled to the semiconductor die 301. This process can be referred to as a "flip chip on wafer" process approach. Although only one semiconductor die 301 is shown flip chip mounted to the wafer 510 for clarity of illustration, a plurality of the semiconductor dies 301 will be mounted to a wafer 510. After the solder balls 323 are attached to form the BGA packaged device, the wafer 510 can be cut into individual BGA CSP devices such as is shown in FIG. 3D. The solder balls form the terminals for the completed devices and can be of diameters in a range from 200 microns to 500 microns. The stress sensitive component 305 is isolated from the remaining portion of the first semiconductor die by a trench or moat 515 that extends into the semiconductor die and surrounds the stress sensitive component 305. The trench isolation is in contrast to the cantilever approach for the "released" stress sensitive component of FIG. 3D. This assembly can be done at the wafer level, with semiconductor wafer 510 used to flip chip mount many of the semiconductor dies 301 in a grid pattern. The solder balls 323 can then be mounted on the semiconductor wafer 510 and the wafer can be cut along scribe lanes to complete the individual devices.

Figure 6:
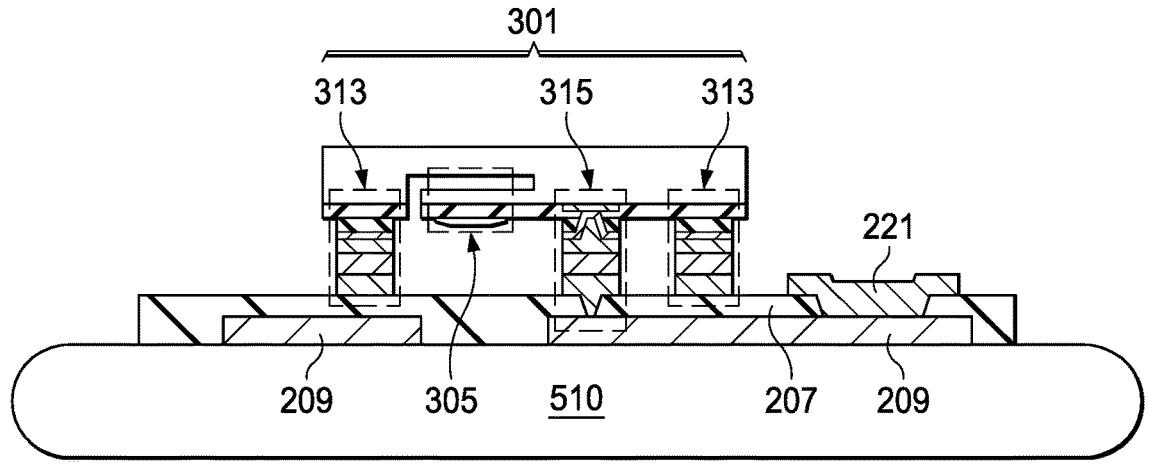
FIG. 6 illustrate in a cross sectional view an in-process wafer for forming a wire bonded arrangement having a first semiconductor die with a stress sensitive component mounted to a second semiconductor die, and having a bond pad terminal.

FIG. 6 illustrates in a cross section a flip chip on wafer approach to form a quad flat no lead packaged device such as shown in FIG. 3C. In FIG. 6, a first semiconductor die 301 is flip chip mounted to a wafer 510. The solder seal 313, the active surface of the wafer 510, and the active surface of the first semiconductor die 301 form a cavity that surrounds the stress sensitive component 305 and the post connect 315. Air will be in the cavity. A bond pad 221 is formed over the polyimide layer 207 and is coupled by a conductor 209 to the post connect 315. Individual devices 301 can be formed from the wafer 510 by sawing through scribe lanes (for example, see FIG. 1). FIG. 3C illustrates a quad flat no lead (QFN) package formed using the flip chip on wafer structure of FIG. 6.

Figure 7A:
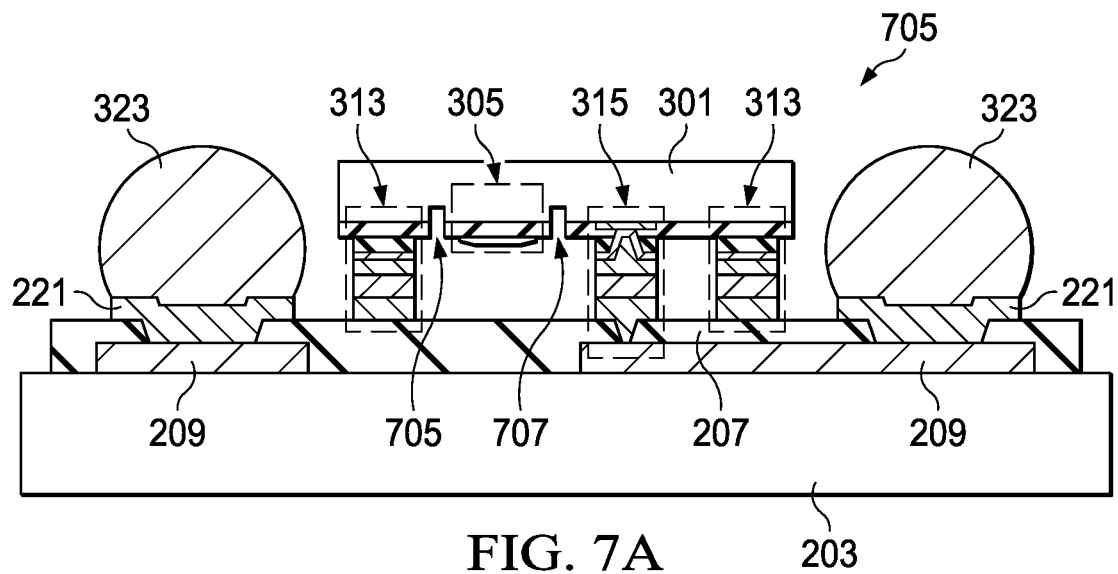
FIGS. 7A-7B illustrate an additional alternative with a stress sensitive component on a first semiconductor die that is isolated by trenches, and mounted to a second semiconductor die in a ball grid array package and a wire bonded package, respectively.
Figure 7B:
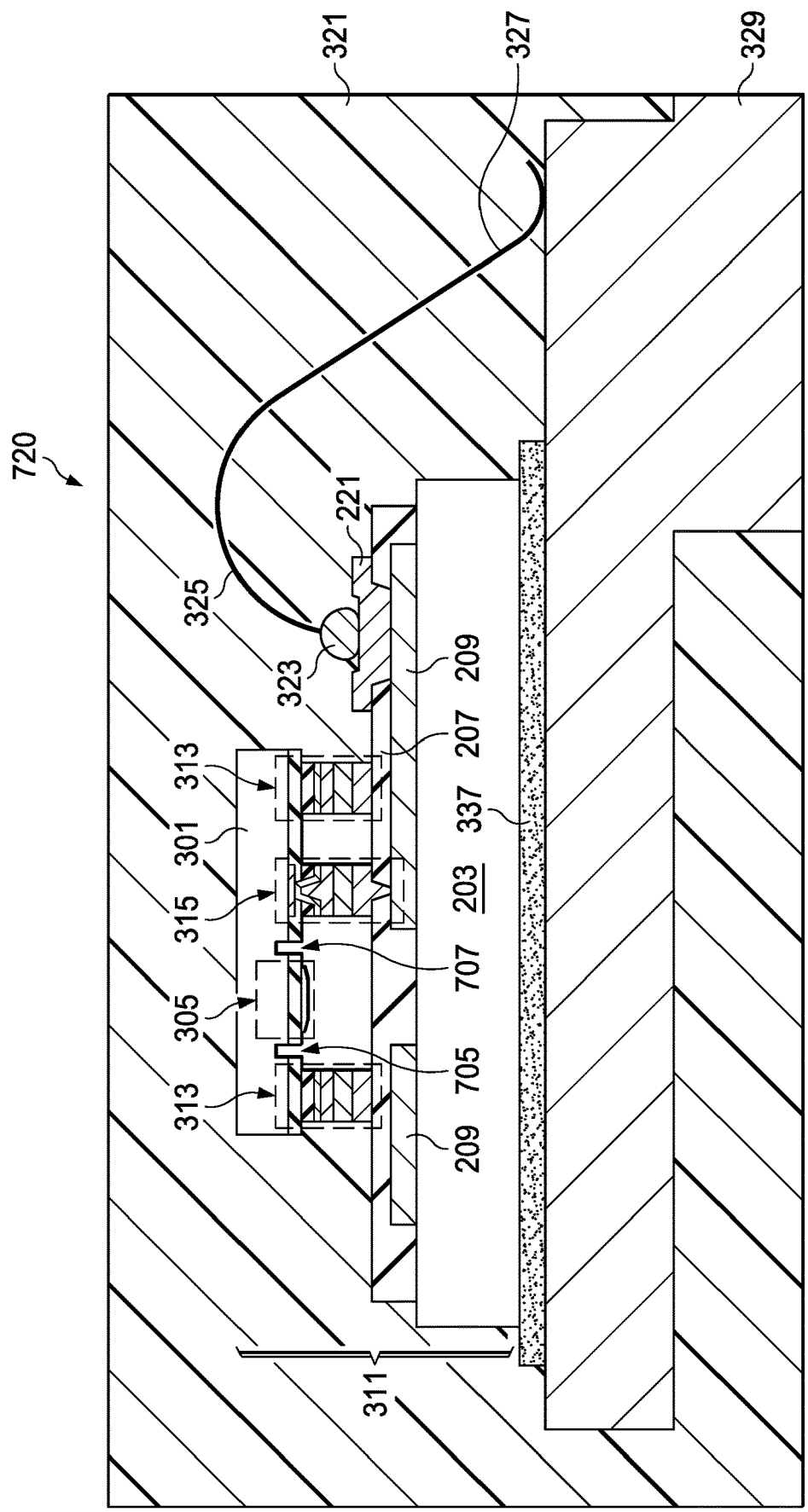

FIGS. 7A-7B illustrate, in two cross sectional views, a CSP package and a quad flat no lead package arrangement, respectively, formed using an alternative isolation approach for a stress sensitive component. In FIG. 7A, a CSP package 701 has isolation trenches 705 and 707 that separate the stress sensitive component 305 from the remaining semiconductor material of the first semiconductor die 301. Semiconductor die 301 is flip chip mounted to a second semiconductor die 203, with the solder seal 313 and post connect 315 arranged as described above. Solder balls 323 form terminals for the packaged device. The trenches 705 and 707 provide isolation (as an alternative to the cantilever structure of FIG. 3D.)

FIG. 7B illustrates a quad flat no lead package 720 similar to the package of the arrangement in FIG. 3C, with the stress sensitive component 305 isolated by trenches 705, 707 from the remaining portion of the semiconductor die 301. A cavity formed by an interior surface of solder seal 313, the surface of the second semiconductor die 203, and the active surface of the first semiconductor die 301, surrounds the stress sensitive component 305 and protects the stress sensitive component 305 from mechanical stress. Post interconnect 315 is also surrounded by the solder seal 313. Mold compound 321 covers the first semiconductor die 301, the second semiconductor die 203, the package substrate 329, and the bond wire 325. A portion of the package substrate 329 exposed from the mold compound 321 forms external leads for the package 720.

Figure 8A:
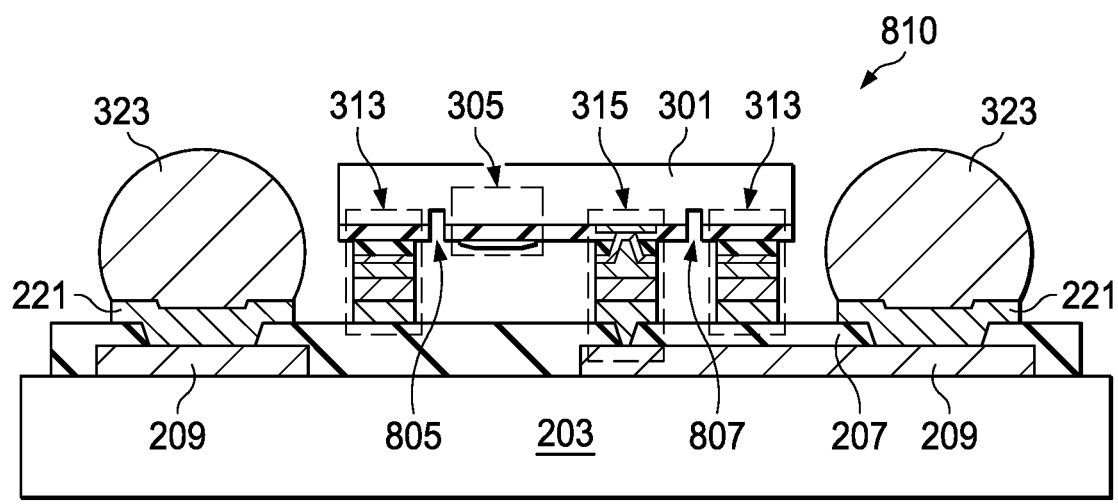
FIGS. 8A-8B illustrate in cross sectional views an additional arrangement having a stress sensitive component including a input/output structure isolated by trenches on a first semiconductor die mounted to a second semiconductor die in a ball grid array package and a wire bonded package, respectively.
Figure 8B:
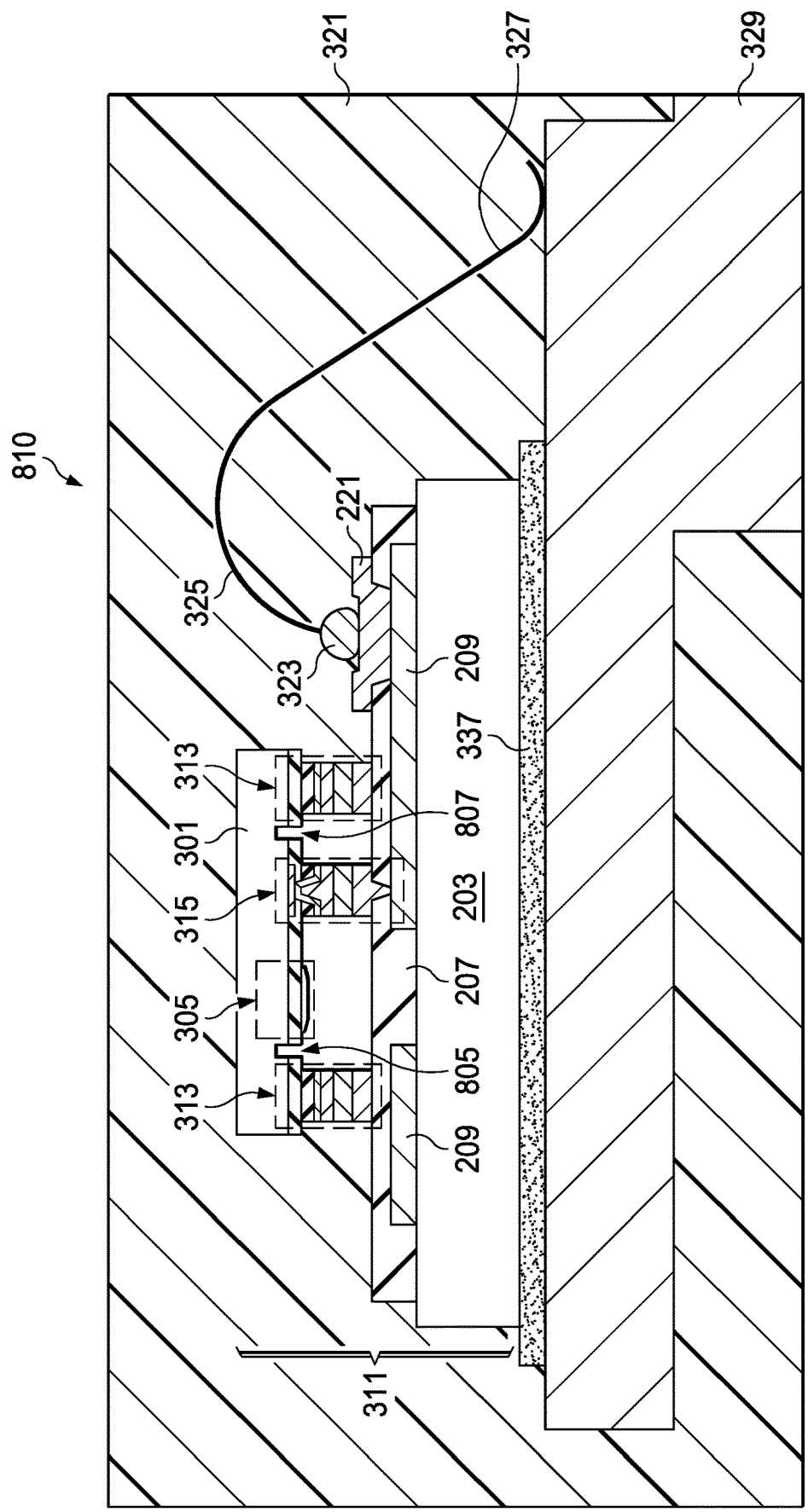

FIGS. 8A-8B illustrate in cross sectional views an alternative arrangement similar to the arrangements of FIGS. 3C-3D. In FIG. 8A, a CSP packaged device 810 is shown with a first semiconductor die 301 including a stress sensitive component 305 flip chip mounted to a second semiconductor die 203, and having a solder seal 313 surrounding the stress sensitive component 305 and a post connect 315. The solder seal 313, the active surface of the second semiconductor die 203, and the active surface of the first semiconductor die 301 form a cavity that protects the stress sensitive component 305. The stress sensitive component 305 and the post connect 315 is isolated from the remainder of the first semiconductor die 301 by trenches 805, 807 that extend into the surface of the first semiconductor die 301. Solder balls 323 form terminals for the BGA CSP device 810. Conductors 209 couple the post connect 315 to a BGA ball 323.

FIG. 8B illustrates an arrangement for a wire bonded packaged electronic device 820 that is similar to the arrangement of FIG. 3C. In FIG. 8B, the stress sensitive component 305 on the first semiconductor die and the post connect 315 are isolated from the rest of the first semiconductor die 301 by trenches 805, and 807, extending into the first semiconductor die. This method of isolation is used instead of the cantilever structure of FIG. 3C described above. The package substrate 329, in this example a conductive lead frame, has a portion that forms terminals for the flat no lead package formed by the mold compound 321. Bond wire 325 couples a ball 323 on the bond pad to the lead frame by a stitch bond 327, and conductor 209 connects the ball 323 to the post connect 315 and then to the first semiconductor die 301.

Figure 9A:
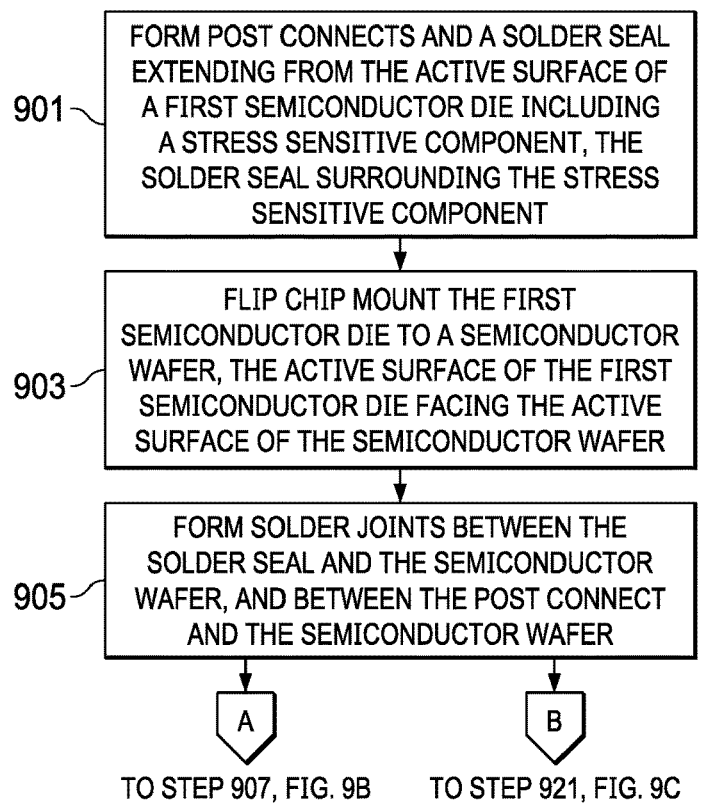
FIGS. 9A-9C illustrate in flow diagrams a series of steps for forming example arrangements.

FIG. 9A illustrates, in a flow diagram, selected steps for a method for forming the arrangements. In FIG. 9A, an in process wafer has post connects and a solder seal formed in an electroplating process as described above with respect to FIGS. 4A-4G. The solder seal surrounds a stress sensitive component on a first semiconductor die as shown in FIG. 4G. At step 903, the first semiconductor die is flip chip mounted to a semiconductor wafer with the active surface of the first semiconductor die facing the active surface of the semiconductor wafer. At step 905, a solder reflow step uses the solder on ends of the solder seal, and the post connects that extend from the first semiconductor die, to form solder joints to the surface of the semiconductor wafer.

Figure 9B:
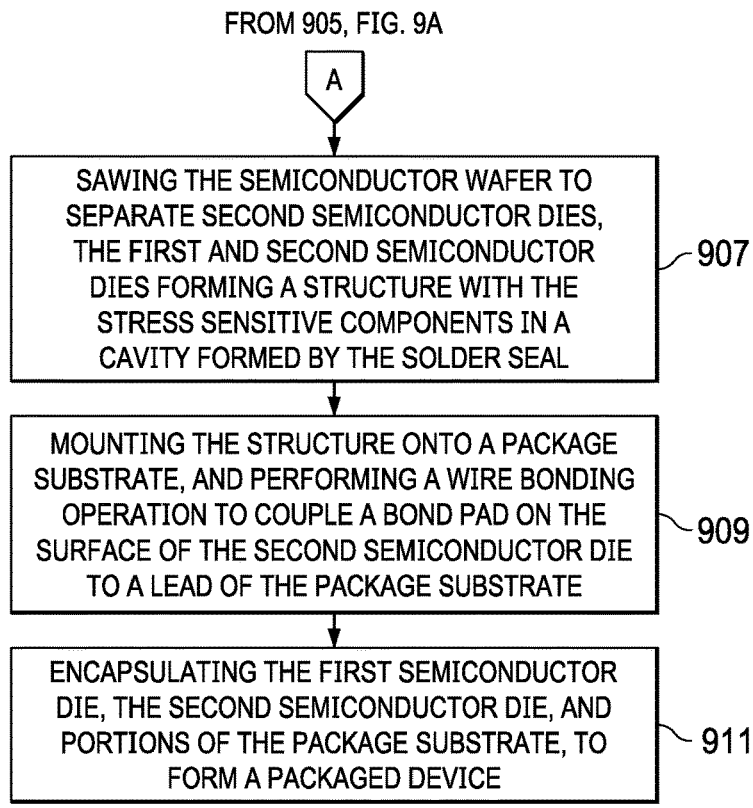

The steps of FIG. 9A can be used to form either an encapsulated wire bonded package, such as shown in FIG. 3C, or a chip scale package (CSP) as shown in FIG. 3D. FIG. 9B illustrates, in an additional flow chart, additional steps forming a wire bonded package. At step 907, the second semiconductor wafer is singulated in a sawing operation, forming separated second semiconductor dies, the second semiconductor dies part of a structure including the first semiconductor die flip chip mounted to the second semiconductor die. The stress sensitive component on the first semiconductor die in a cavity formed by the solder seal, the surface of the second semiconductor die, and the active surface of the first semiconductor die.

Figure 9C:
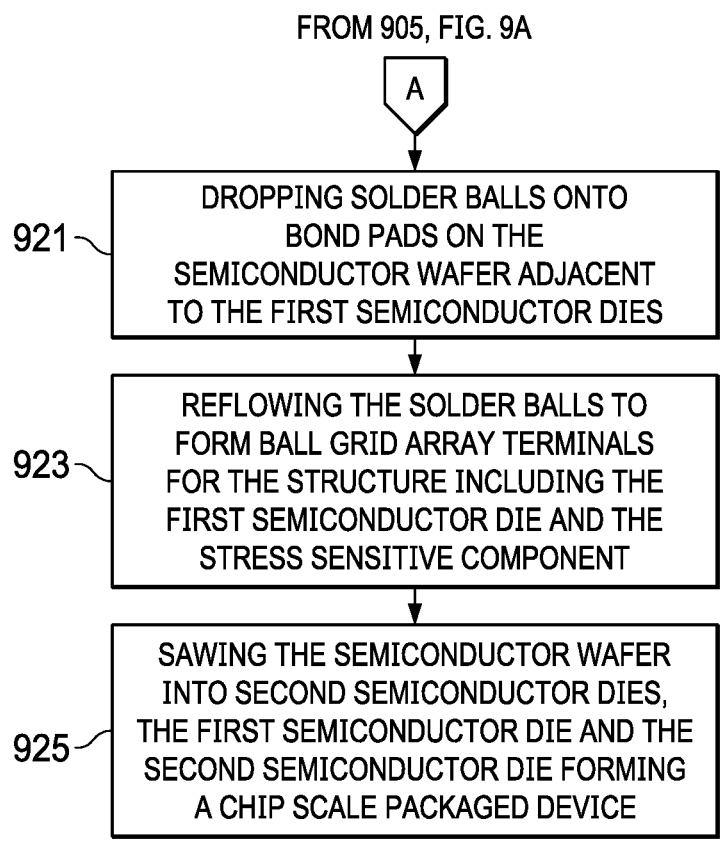

FIG. 9C illustrates, in another flow diagram, additional steps to form a chip scale package (CSP) device following the steps of FIG. 9A. At step 921, which begins after step 905 in FIG. 9A, solder balls are dropped onto bond pads on the semiconductor wafer. The bond pads are coupled by traces to the post connect extending from the first semiconductor die, as shown in FIG. 5, for example. The method continues at step 923, where a reflow step bonds the solder balls onto the bond pads, forming terminals for the CSP device. At step 925, the method continues when the semiconductor wafer is singulated, separating the finished CSP devices one from another, to form a single unit device, for example as shown in FIG. 3D.

The stress sensitive components can be isolated from the remainder of the first semiconductor die using the cantilever structure shown in FIGS. 3C-3D or isolated by trenches as shown in FIGS. 7A-7B, or by the alternative trenches shown in FIGS. 8A-8B. The semiconductor etch steps can be done prior to or after other processing steps, as shown in FIGS. 4C-4G, or as shown in FIGS. 4H-4J.

Modifications are possible in the described arrangements, and other alternative arrangements are possible within the scope of the claims.

What is claimed is:

1. An apparatus, comprising:
   a first semiconductor die with a component on a first surface, the first semiconductor die having an opposite second surface;
   a second semiconductor die mounted on a package substrate and having a third surface facing away from the package substrate;
   a solder seal bonded to and extending from the first surface of the first semiconductor die which is flip chip mounted to the third surface of the second semiconductor die, the solder seal at least partially surrounding the component;

a first solder joint formed between the solder seal and a dielectric material overlying the third surface of the second semiconductor die, the first solder joint physically contacting the dielectric material;

a post connect extending from the first surface of the first semiconductor die;

a second solder joint formed between solder at an end of the post connect and a conductive land on a dielectric layer overlying the third surface of the second semiconductor die; and a mold compound covering the second surface of the first semiconductor die, a portion of the second semiconductor die, and an outside periphery of the solder seal.

2. The apparatus of claim 1, wherein a cavity bounded by interior sidewalls of the solder seal, the dielectric layer overlying the third surface of the second semiconductor die, and the first surface of the first semiconductor die contains air.

3. The apparatus of claim 1, wherein a cavity formed by interior sidewalls of the solder seal, the dielectric layer overlying the third surface of the second semiconductor die, and the first surface of the first semiconductor die is free from mold compound.

4. The apparatus of claim 1, wherein the component further comprises one selected from a transistor, an analog-to-digital converter, a bulk acoustic wave (BAW) device, and a sensor.

5. The apparatus of claim 1, wherein the package substrate is a metal lead frame, and further comprising a bond wire connection extending from a bond pad exposed from the dielectric layer over the third surface of the second semiconductor die to a conductive portion of the metal lead frame.

6. The apparatus of claim 5, wherein the apparatus forms a no-lead semiconductor package.

7. The apparatus of claim 1, and further comprising a solder ball forming a ball grid array terminal on a bond pad exposed from the dielectric material overlying the third surface of the second semiconductor die.

8. The apparatus of claim 7, wherein the apparatus forms a chip scale ball grid array (BGA) package, and the solder ball forms a terminal for the BGA package.

9. The apparatus of claim 1, wherein the component is formed on a portion of the first semiconductor die that is isolated from a remaining portion of the first semiconductor die by a cantilever structure.

10. The apparatus of claim 1, wherein the component is formed on a portion of the first semiconductor die that is isolated from a remaining portion of the first semiconductor die by trenches extending into the semiconductor die.

11. An apparatus, comprising:

a first semiconductor die including a stress sensitive component;

a post connect electrically connecting the first semiconductor die to a second semiconductor die;

a solder seal at least surrounding the stress sensitive component and the post connect, the solder seal including:

a polyimide layer contacting the first semiconductor die;

a seed layer on the polyimide layer;

a metal layer contacting the seed layer; and a solder layer contacting the metal layer, wherein the solder layer contacts a dielectric material of the first semiconductor die.

12. The apparatus of claim 11 further comprising a mold compound covering portions of the first semiconductor die, the second semiconductor die, the post connect and the solder seal.

13. The apparatus of claim 12, wherein the solder seal forms a cavity around the stress sensitive component.

14. The apparatus of claim 13, wherein the cavity is formed by an interior surface of the solder seal, a surface of the second semiconductor die, and a surface of the first semiconductor die.

15. The apparatus of claim 13, wherein the cavity is free of mold compound.

16. The apparatus of claim 11, wherein the post connect contacts a bond pad of the first semiconductor die.

17. The apparatus of claim 11, wherein the solder seal is a continuous structure that surrounds the stress sensitive component.

18. The apparatus of claim 11, wherein the stress sensitive component is one selected from a transistor, an analog-to-digital converter, a bulk acoustic wave (BAW) device, and a sensor.

19. The apparatus of claim 11, wherein the second semiconductor die mounted on a package substrate.

* * * * *